(12) United States Patent
Mahoney et al.

(10) Patent No.: US 7,083,428 B1
(45) Date of Patent: Aug. 1, 2006

(54) HYBRID INTERFACE APPARATUS FOR TESTING INTEGRATED CIRCUITS HAVING BOTH LOW-SPEED AND HIGH-SPEED INPUT/OUTPUT PINS

(75) Inventors: David M. Mahoney, San Jose, CA (US); Mohsen Hossein Mardi, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/195,435

(22) Filed: Aug. 2, 2005

Related U.S. Application Data

(62) Division of application No. 10/703,836, filed on Nov. 7, 2003, now Pat. No. 6,958,616.

(51) Int. Cl.
*H01R 12/00* (2006.01)

(52) U.S. Cl. ....................................................... 439/70

(58) Field of Classification Search ............ 430/70–71, 430/66–67, 83, 91, 76.1, 78, 74–75; 29/843; 174/262
See application file for complete search history.

(56) References Cited

U.S. PATENT DOCUMENTS

| | | | |
|---|---|---|---|
| 5,185,736 | A | 2/1993 | Tyrrell et al. |
| 5,639,247 | A | 6/1997 | Johnson et al. |
| 5,955,888 | A | 9/1999 | Frederickson et al. |
| 6,174,172 | B1 * | 1/2001 | Kazama ........................ 439/66 |
| 6,404,211 | B1 | 6/2002 | Hamel et al. |
| 6,443,745 | B1 * | 9/2002 | Ellis et al. ................... 439/101 |
| 2001/0010274 | A1 * | 8/2001 | Koga et al. ................... 174/262 |

* cited by examiner

*Primary Examiner*—Jean Frantz Duverne
(74) *Attorney, Agent, or Firm*—Patrick T. Bever

(57) ABSTRACT

A hybrid interface apparatus including a fixed base including a contact-locking structure supporting several spring-based contact members, and a nesting member slidably positioned over the fixed base and having a central test area that includes an array of through-holes that are aligned with upper ends of the contact members. To facilitate testing of ICs including both relatively low-speed general-purpose I/O structures and new high-speed I/O structures, the contact members mounted on the contact structure include both low-cost, relatively high-inductance contact members for facilitating communication with the general-purpose I/O structures of the IC, and relatively expensive, low-inductance contact members for facilitating high-speed communications with the high-speed I/O structures of the IC.

17 Claims, 5 Drawing Sheets

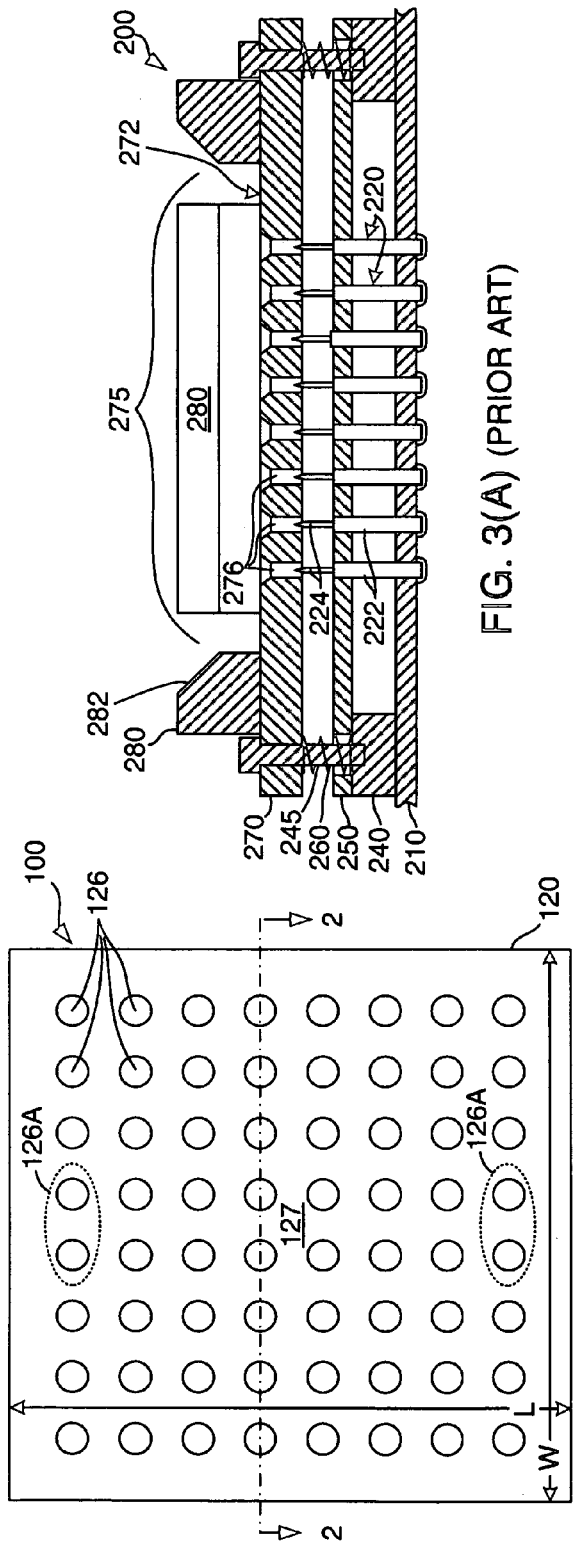
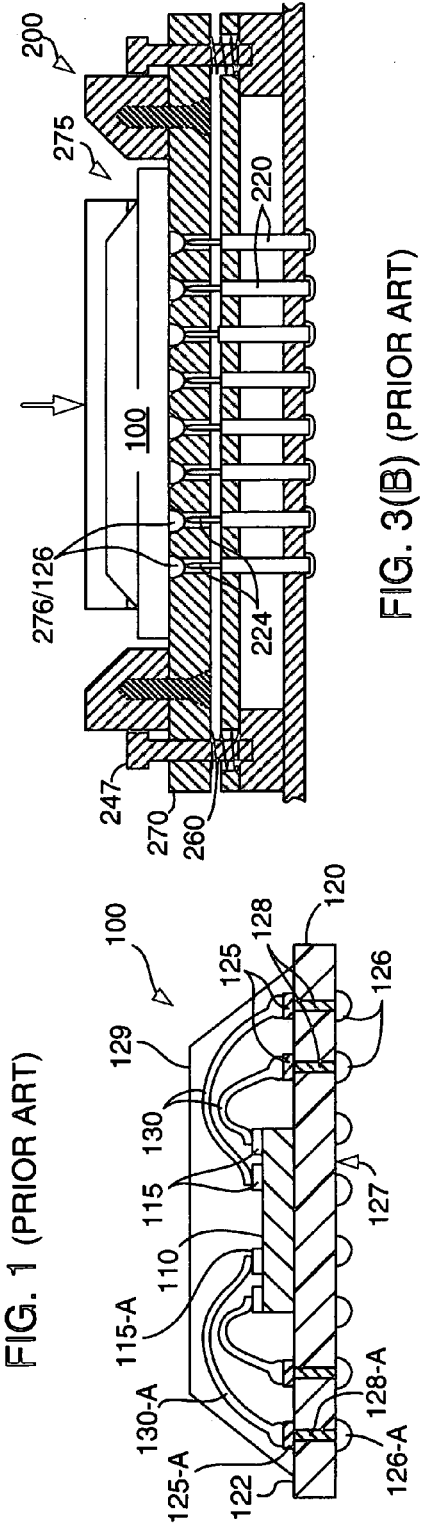
FIG. 1 (PRIOR ART)
FIG. 2 (PRIOR ART)
FIG. 3(A) (PRIOR ART)
FIG. 3(B) (PRIOR ART)

HYBRID INTERFACE APPARATUS FOR TESTING INTEGRATED CIRCUITS HAVING BOTH LOW-SPEED AND HIGH-SPEED INPUT/OUTPUT PINS

FIELD OF THE INVENTION

The present invention relates to integrated circuit device testers, and more particularly to an interface apparatus and method for testing ball packaged integrated circuits having both low-speed and high-speed input/output structures.

BACKGROUND OF THE INVENTION

Integrated circuit (IC) devices typically include an IC chip that is housed in a plastic, ceramic or metal package. The IC chip typically includes a circuit fabricated by lithographically patterning conductive and insulating materials on a thin wafer of semiconductor material (e.g., silicon) using known fabrication techniques (e.g., CMOS). The package supports and protects the IC chip and provides electrical connections between the circuit and an external circuit or system.

Programmable Logic Devices (PLDs) are IC devices that are user configurable, and capable of implementing digital logic operations. There are several types of PLDs, including Field Programmable Gate Arrays (FPGAs) and Complex Programmable Logic Devices (CPLDs). CPLDs typically include several function blocks that are based on the well-known programmable logic array (PLA) architecture, and include a central interconnect matrix to transmit signals between the function blocks. Signals are transmitted into and out of the interconnect matrix through input/output blocks (IOBs). The input/output function of the IOBs, the logic performed by the function blocks and the signal paths implemented by the interconnect matrix are all controlled by configuration data stored in configuration memory of the CPLD. FPGAs include configurable logic blocks (CLBs) arranged in rows and columns, IOBs surrounding the CLBs, and programmable interconnect lines that extend between the rows and columns of CLBs. Each CLB includes look-up tables and other configurable circuitry that is programmable to implement a portion of a larger logic function. Similar to CPLDs, the CLBs, IOBs and interconnect lines of FPGAs are controlled by configuration data stored in a configuration memory of the FPGA.

Modern PLDs are highly complex, and often include more than one hundred Input/Output (I/O) structures (i.e., I/O (circuit) blocks and associated bonding pads connected to the I/O blocks) that access the programmable logic circuitry therein. To support the large number of I/O structures, PLDs are typically mounted in a package including multiple external contacts (e.g., pins, solder balls/bumps, or wire leads). Several package types are used to house PLD chips, including ball grid arrays (BGAs), pin grid arrays (PGAs), plastic leaded chip carriers, and plastic quad flat packs. The package type selected by an IC manufacturer for a particular IC chip is typically determined by the size/complexity of the IC chip (i.e., the number of input/output terminals), and also in accordance with a customer's requirements.

FIGS. 1 and 2 show bottom and side sectional views, respectively, of a typical BGA IC 100 including an IC chip 110 mounted on an upper surface 122 of a package substrate 120. Electrical connections between bonding pads 115 of IC chip 110 and contact pads 125 formed on upper surface 122 of substrate 120 are provided by bond wires 130. A plurality (sixty-four shown) of solder balls (sometimes referred to as solder bumps) 126 extend from a lower surface 127 of substrate 120 which are electrically connected to the conductive lines (not shown) and conductive vias 128 that are provided on substrate 120. Electrical signals travel between each solder ball 126 and one bonding pad 115 of IC chip 110 along an associated conductive line/via 128 and bond wire 124. For example, a test signal applied to solder ball 126-A is transmitted on conductive via 128A to contact pad 125A, and from contact pad 125A along bond wire 130A to bonding pad 115 of substrate 110. A cover 129, such as a cap or "glob top", is placed or formed over IC chip 110 and bond wires 130 for protection.

IC manufacturers typically use IC testing systems to test their packaged IC devices before shipping to customers. IC testing systems typically include a device tester, a device handler and an interface apparatus. A device tester is an expensive piece of computing equipment that transmits test signals to the IC device under test via tester probes and the interface apparatus. The interface apparatus transmits signals between the leads of an IC device under test and the device tester. A device handler is an expensive precise robot for automatically moving IC devices from a storage area to the interface apparatus and back to the storage area. Such testing systems are well known.

FIGS. 3(A) and 3(B) show side and top views of a conventional interface apparatus 200 that is disclosed in U.S. Pat. No. 5,955,888.

Interface apparatus 200 includes a printed circuit board (PCB) 210 having mounted thereon a plurality of contact members (i.e., pogo pins) 220, a contactor body 240 mounted on PCB 210, and a nesting member 270 that is mounted over contactor body 240. PCB 210 includes connection structures (not shown) for receiving test signals from a device tester, and conductive lines (also not shown) for transmitting signals between the connection structures and pogo pins 220. Contactor body 240 includes four walls that are formed into a generally square or rectangular frame through which pogo pins 220 extend. A non-conductive plate 250 is mounted on an upper surface of contactor body 240 for aligning pogo pins 220 such that a tip 224 of each pogo pin 220 is aligned with a corresponding through-hole 276 formed in nesting member 270. Nesting member 270 is slidably mounted on shoulder bolts 245 that extend upward from contactor body 240, and is biased away from contactor body 240 by coil springs 260. Mounted on an upper surface 272 of nesting member 270 is a fixed (permanently attached) series alignment structures 280 that define an IC receiving (test) area 275, which includes through-holes 276.

Referring to FIG. 3(B), during a test procedure a BGA IC 100 is lowered into IC receiving area 275 of nesting member 270 by a device handler (not shown). Alignment structures 280 are formed with slanted walls 282 that facilitate "rough" alignment by causing BGA IC 100 to slide into IC receiving area 275. Subsequently, each solder ball 126 becomes engaged with an associated through-hole 276, which are chamfered to provide "fine" alignment of BGA IC 100 relative to pogo pins 220. BGA IC 100 and nesting member 270 are then pressed downward (as indicated by the arrow) to compress springs 260 until tips 224 of pogo pins 220 contact solder balls 126, thereby providing electrical connections between a testing device (not shown) connected to pogo pins 220 and IC device 100 for the testing procedure.

As FPGAs increase in size and performance, I/O resources become the main bottleneck to FPGA performance. Although the effective area of a chip grows as the square of the feature size, the perimeter I/Os grow only linearly. State of the art designs require higher performance I/O structures in order to compensate for this declining pin-to-gate ratio. In response to this increasing demand on I/O resources, Xilinx Inc. of San Jose, Calif. has developed high-speed I/O structures called Rocket I/O™ multi-gigabit transceivers (MGTs) that enable order-of-magnitude increases in I/O performance. The Rocket I/O MGTs double the total I/O bandwidth of the Xilinx Virtex-II Pro™ family of FPGA devices using only a few percent of the pins. With up to sixteen MGTs per device (the remaining I/O structures of the device being of a conventional general-purpose type), the Virtex-II Pro achieves an additional 100 gigabits per second of I/O bandwidth in the larger devices over FPGA devices utilizing only general-purpose I/O structures. Rocket I/O MGTs enable multiple gigabit I/O standards and maximize performance for FPGA-to-FPGA communications. Even though Rocket I/O MGTs dramatically increase performance for demanding applications, they are easy enough to use for simple FPGA-to-FPGA communications with special soft macros. The interface has been simplified to the extent that no external resistive termination is required with the Rocket I/O MGTs. The transceivers can be internally configured to match 50 ohm or 75 ohm transmission lines.

FPGAs (and other ICs) that include both general-purpose, relatively low-speed I/O structures and the new high-speed I/O structures (such as the Rocket I/O MGTs described above) present several challenges during device testing. One such problem is that conventional interface apparatus, such as interface apparatus 200 (described above) are typically built with contact members (e.g., pogo pins 220; see FIG. 3(A)) that are selected to support the relatively low-speed transmissions associated with the general-purpose I/O structures. Specifically, these contact members have impedances that are too high to support the high-speed communications associated with the high-speed I/O structures. One approach to correct this problem is to replace the sixteen contact members used to transmit signals to the high-speed I/O structures with low impedance, high-speed contact members. However, this mismatched arrangement (i.e., using some low-speed contact members and some high-speed contact members) creates new problems because high-speed contact members are typically shorter and have a lower spring constant that low-speed contact members. That is, the tips of the shorter, high-speed contact members would be further from the solder balls than the tips of the longer, low-speed contact members, thereby possibly preventing suitable contact during test procedures and impeding reliable testing of the IC device. Another approach that avoids the mismatch problem described above would be to replace all of the low-speed contact members with high-speed contact members. However, high-speed contact members are typically much more expensive than low-speed contact members, so the overall cost of an interface apparatus using only high-speed contact members would be undesirably high.

What is needed is a low-cost interface apparatus for testing ICs having both low-speed and high-speed I/O structures that avoids the problems described above.

SUMMARY OF THE INVENTION

Embodiments of the present invention are directed to a hybrid interface apparatus that utilizes two types of spring-based contact members (spring contacts) having similar lengths and spring constant characteristics to test ICs having both low-speed and high-speed I/O pins. A first spring contact type, which is relatively inexpensive and formed using conventional methods, is utilized to transmit relatively low-speed test signals (e.g., approximately 1–2 MHz) between a tester and low-speed I/O structures of the IC device. A second, relatively expensive spring contact type, which is constructed using special techniques to exhibit relatively low-inductance values capable of supporting high-speed (e.g., approximately 10 MHz) communications, is utilized to transmit test signals between high-speed I/O pins of the IC device. Because both the first and second spring contact types have similar lengths and similar spring constants, the first and second spring contacts can be utilized in a single hybrid interface apparatus interface structure while avoiding the mismatch problems associated with conventional interface apparatus using two types of pogo pin contact members. Further, because the number of expensive spring structures utilized on the hybrid interface apparatus is limited to the number of high-speed I/O pins of the IC device (the remaining spring structures of the hybrid interface apparatus being of the low-cost type), the overall cost of the hybrid interface structure is significantly reduced over interface apparatus constructed using only high-speed contact members.

In accordance with an embodiment of the present invention, a hybrid interface apparatus is provided for interfacing between a device tester and a packaged integrated circuit (IC) that includes both high-speed and low-speed I/O structures. The hybrid interface apparatus includes a fixed base supporting several spring-type contact members, and a nesting member movably mounted over the fixed base such that the nesting member is movable toward and away from the contact members. The fixed base includes a printed circuit board (PCB) having contact pads formed on its upper surface, and a contact-locking structure mounted over the contact pads. The nesting member is mounted over the contact-locking structure, and includes a substrate having a central test area defining holes that extend through the substrate and are aligned with upper ends of the spring-type contact members. According to embodiments of the present invention, all of the spring-type contact members have a similar length and spring constant, but a first group of the spring-type contact members are relatively high-cost and have a relatively low-inductance for facilitating high-speed communication between the high-speed I/O structures of the IC and the tester, and a second group of the spring-type contact members are relatively low-cost and have a relatively high-inductance, and are used to facilitate communication between the general-purpose I/O structures of the IC and the tester. The contact members are mounted on the contact-locking structure such that a lower end of each contact member abuts a corresponding contact pad of the PCB, and an upper end of each contact member is aligned with and partially extends into a corresponding through-hole formed in the substrate of the nesting member. The pitch between contact members can vary to align with the contact pad, as well as the diameter. When the IC is mounted in the test area of the nesting member and pressed downward (i.e., toward the fixed base), the solder balls extending from the lower surface of the IC DUT contact the upper ends of the spring-type contact members. By selectively positioning the high-cost, low impedance contact members to contact only high-speed I/O structures, and utilizing the low-cost, relatively high impedance contact members to contact the general-purpose I/O structures, the overall cost of the hybrid interface structure is minimized while avoiding the mismatch problems associated with conventional interface structures.

According to another specific embodiment, of the present invention, the low-cost, relatively high-inductance contact members are helical coil spring structures formed using conventional techniques, and the relatively high-cost, low-inductance contact members are formed either by wrapping a high-conductance wire (e.g., gold) around a relatively low-conductance helical coil base, and/or by forming a two-part spring having a central straight section, an upper section coiled in a first (e.g., clockwise) direction, and a lower section coiled in a second (e.g., counterclockwise) direction. Another low-inductance contact member type may include a standard spring contact member having a fuzz button-type contact member mounted therein.

In accordance with another embodiment of the present invention, a method for testing ICs including both high-speed and general-purpose I/O structures includes identifying the locations of all high-speed I/O structures, and then forming a hybrid interface apparatus including spring-type contact members having a similar length and spring constant, wherein a first group of the spring-type contact members having a relatively low-inductance are positioned to contact the high-speed I/O structures of the IC, and a second group of the spring-type contact members having a relatively high-inductance are positioned to contact the general-purpose I/O structures of the IC.

BRIEF DESCRIPTION OF THE DRAWINGS

These and other features, aspects and advantages of the present invention will become better understood with regard to the following description, appended claims, and accompanying drawings, where:

FIG. 1 shows a bottom of a BGA IC;

FIG. 2 is a sectional side view taken along line 2—2 of FIG. 1;

FIGS. 3(A) and 3(B) are sectional side views of a conventional interface structure for testing BGA ICs;

DETAILED DESCRIPTION OF THE DRAWINGS

Figure 4:
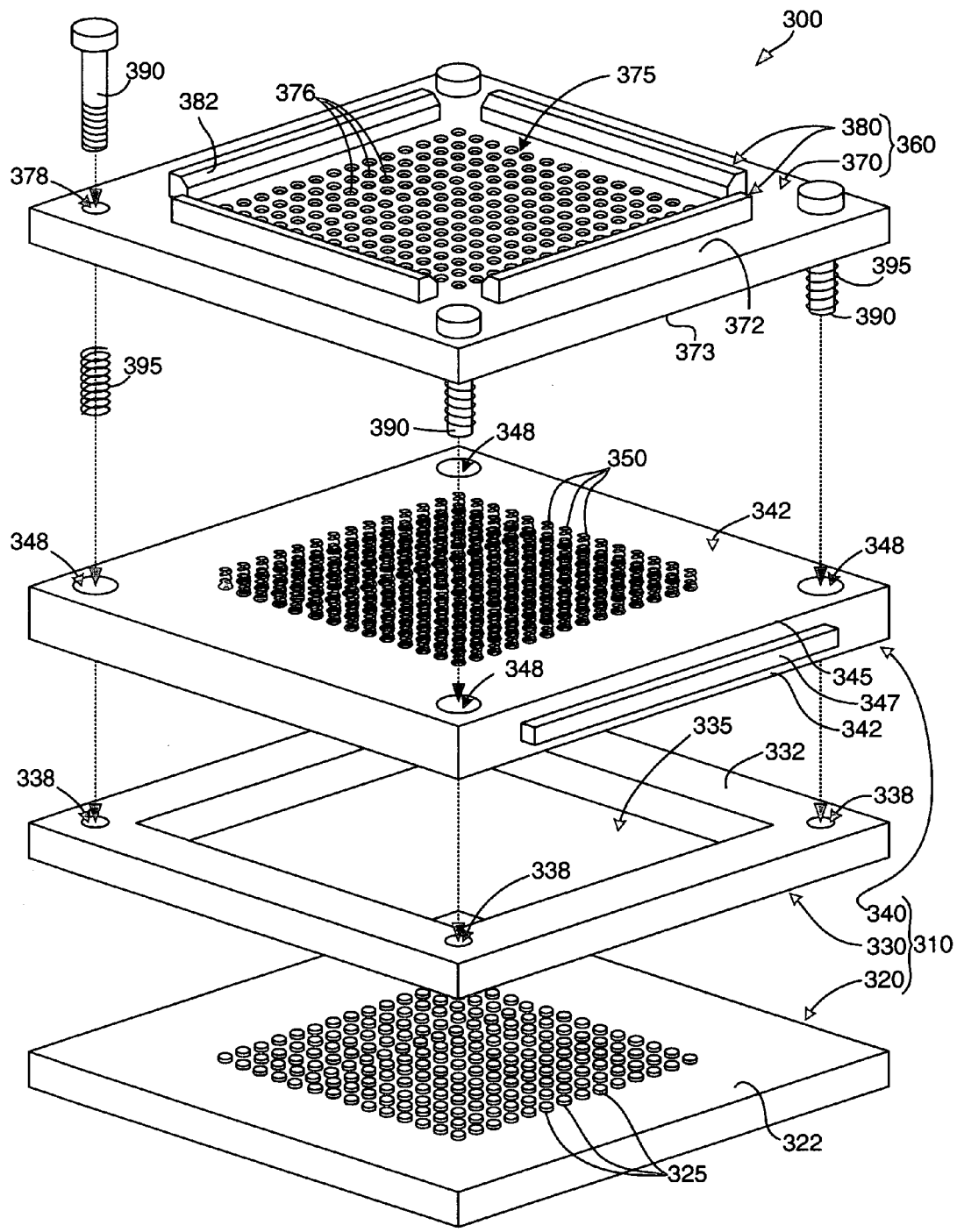
FIG. 4 is an exploded perspective view showing a hybrid interface apparatus according to an embodiment of the present invention.

FIG. 4 is an exploded perspective view showing a hybrid interface apparatus 300 in accordance with an embodiment of the present invention. Interface apparatus 300 is utilized with a device tester to facilitate testing of ball grid array integrated circuits (BGA ICs) that have both special purpose high-speed I/O structures and general-purpose (i.e., relatively low-speed) I/O structures, such as the Xilinx Virtex-II Pro™ family of FPGA devices (discussed above). As used herein, the term "BGA IC" refers to any IC product having solder balls or bumps used to connect a packaged IC to an external circuit board using, for example, standard reflow techniques. Although the embodiment described herein specifically discloses BGA type I/O pins, those skilled in the art will recognize that embodiments of the present invention may also be utilized to test pin grid array (PGA) type packages as well.

Interface apparatus 300 generally includes a fixed base 310 and a nesting member 360 that is slidably mounted on guide shafts 390 extending from an upper surface of fixed base 310 having a plurality of spring contact members 350 extending therefrom, and a nesting member 360 slidably mounted on fixed base 310 over spring contact members 350.

Referring to the lower portion of FIG. 4, fixed base includes a printed circuit board (PCB) 320, a frame 330 mounted on PCB 320, and a contact-locking structure 340 mounted on frame 330. PCB 320 is a conventional (e.g., FR-4-based) laminated PCB structure having an upper surface 322 that includes a plurality of contact pads 325. Although not shown, a series of conductors are formed in the layers of PCB 320 using known techniques to facilitate the transmission of test signals from a tester (not shown) to contact pads 325. Frame 330 is mounted on upper surface 322, and includes a peripheral wall 332 surrounding a central region 335. When frame 330 is mounted on PCB 320 (e.g., using a suitable adhesive), wall 332 surrounds contact pads 325 such that contact pads 325 are exposed within central region 335. Frame 330 also includes four threaded holes 337 formed in the corners of wall 332 that are utilized to secure contact-locking structure 340 and nesting member 310 in the manner described below. Contact-locking structure 340 is mounted over frame 330, and includes a lower wall 342, an upper wall 345, and an intermediate (locking) wall 347 slidably received between lower wall 342 and upper wall 345. Contact-locking structure 340 also defines a series of through-holes 348 that are utilized as described below. Spring contact members 350 are connected to contact-locking structure 340 such that a first portion of each spring contact member extends downward from lower wall 342, a second portion (shown in FIG. 3) extends upward from upper wall 345, and a central portion extends through corresponding holes formed in lower wall 342, wall 345, and intermediate wall 347. Spring contact members 350 and contact-locking structure 340 are described in additional detail below.

Referring to the upper portion of FIG. 4, nesting member 360 includes a substrate 370, and a series of positioning members 380 fixedly connected to substrate 370. Substrate 370 is a substantially flat plate formed from an electrically insulating material, and defines an upper surface 372 and a lower surface 373. Upper surface 372 includes a test area 375 including a plurality of through-holes 376 that extend from upper surface 372 to lower surface 373. Substrate 370 also defines a series of through-holes 378 that are utilized as described below. Positioning members 380 are positioned on upper surface 372 such that they surround test area 375.

Nesting member 360 is slidably connected to fixed base 310 by way of guide shafts (bolts) 390, and is supported by spring members 395. Each guide shaft 390 passes through a corresponding through hole 378 of substrate 370, a corresponding through hole 348 of contact-locking structure 340, and is secured in a corresponding threaded hole 338 of frame 330. Each guide shaft 390 passes through a corresponding spring 395, which serves to bias nesting member 360 away from fixed base 310 in the manner described below.

Figure 5A:
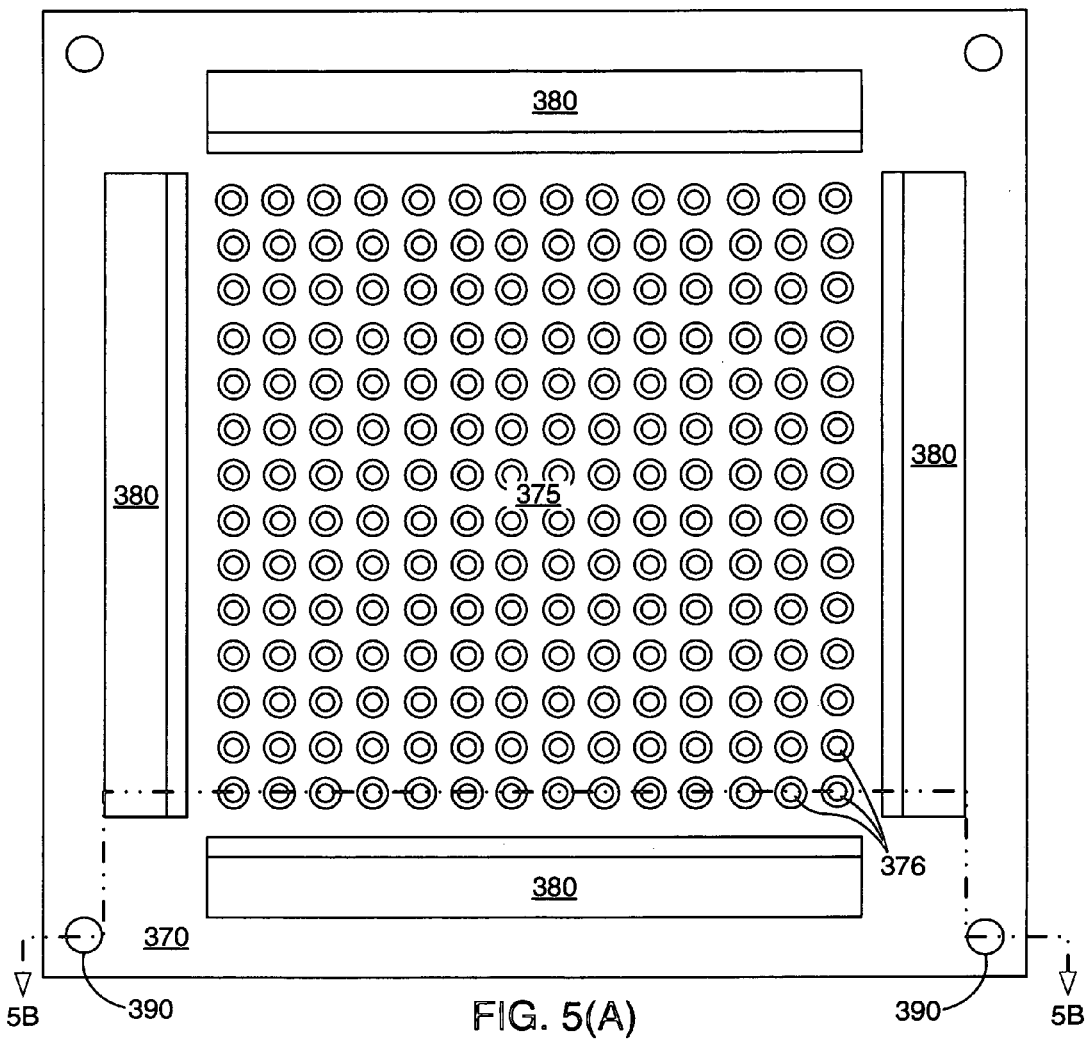
FIGS. 5(A) and 5(B) are top and sectional side views showing the hybrid interface apparatus of FIG. 4.
Figure 5B:
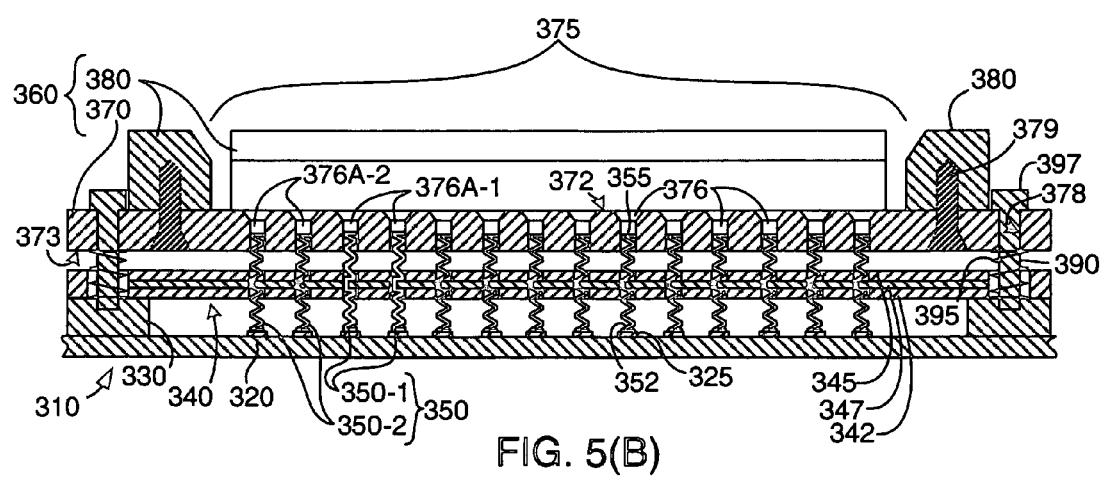

FIGS. 5(A) and 5(B) are top plan and cross-sectional side views showing interface apparatus 300 in additional detail. FIG. 5(A) shows the array of through-holes 376 associated with test area 375, and the surrounding positioning members 380. The cross-sectional side view shown in FIG. 5(B) is taken along section line 5B—5B of FIG. 5(A).

Referring to the upper portion of FIG. 5(B), nesting member 360 is slidably mounted on guide shafts 390 and biased away from fixed body 310 by coil springs 395. The upward movement of nesting member 360 is restricted by heads 397 formed on the upper end of guide shafts 390. Test area 375 is located in a central region of nesting member 360, and is surrounded by positioning member 380. As mentioned above, each through-hole 376 is positioned over an upper end 355 of a corresponding spring contact member 350. Positioning members 380 are permanently attached to substrate 370, and include slanted walls 382 that slope toward test area 375 for positioning gravity-feeding BGA ICs onto upper surface 372 of substrate 370. Positioning members 380 may be formed separately and mounted onto substrate 370 using, for example, screws 379 or an adhesive. Alternatively, positioning members 380 and substrate 370 may be machined from a single piece of, for example, Vespel™ (a registered trademark of E.I. du Pont de Nemours and Company) or other non-conductive material.

As shown in the lower portion of FIG. 5(B), each spring-like contact member 350 includes a lower (first) end 352 abutting a corresponding contact pad 325 formed on PCB 320, and a second end 355 extending into a corresponding through-hole 376 of nesting member 360. A central portion of each contact structure 350 extends through corresponding holes formed in lower wall 342, upper wall 345, and slidable intermediate wall 347. During assembly, intermediate wall 347 is manipulated (slid) to align these three sets of holes, and spring structures 350 are then inserted and positioned as shown in FIG. 5(B). Slidable intermediate wall 347 is then slid such that the hole formed in slidable intermediate wall 347 is partially misaligned with the holes formed in lower wall 342 and upper wall 345, thereby causing an edge of intermediate wall 347 to pinch the central portion of contact member 350. Thus secured, contact-locking structure 340 is mounted onto frame 330, and nesting member 360 is secured as indicated in FIG. 5(B) using guide shafts 390 and springs 395.

According to an embodiment of the present invention, contact members 350 include two types: a first contact member 350-1 having a relatively low-inductance for facilitating high-speed communications with high-speed I/O structures of an IC, and a second contact member 350-2 having a relatively high-inductance for facilitating communications with general-purpose I/O structures of the IC. As discussed below, the low-inductance, high-speed contact members 350-1 require special manufacturing and/or materials that make these contact members relatively more expensive than high-inductance contact members 350-2. Therefore, low-inductance contact members 350-1 are positioned to only contact the high-speed I/O structures of an IC to be tested, and high-inductance contact structures 350-2 are utilized to contact the remaining general-purpose I/O structures. Accordingly, prior to testing an IC having both high-speed and general-purpose I/O structures, a technician will identify the location of each high-speed I/O structure, and mount low-inductance contact structures 350-1 below corresponding through-holes 376A-1 through which contact is made with these high-speed I/O structures. Conversely, the technician will mount high-inductance contact structures 350-2 below corresponding through-holes 376A-2 through which contact is made with general-purpose I/O structures of the IC.

A device testing procedure utilizing interface apparatus 300 will now be described with reference to FIGS. 6(A), 6(B) and 6(C). These figures show a BGA IC 100A including high-speed I/O structures that are connected to solder balls 101, and general-purpose I/O structures that are connected to solder balls 102.

Figure 6A:
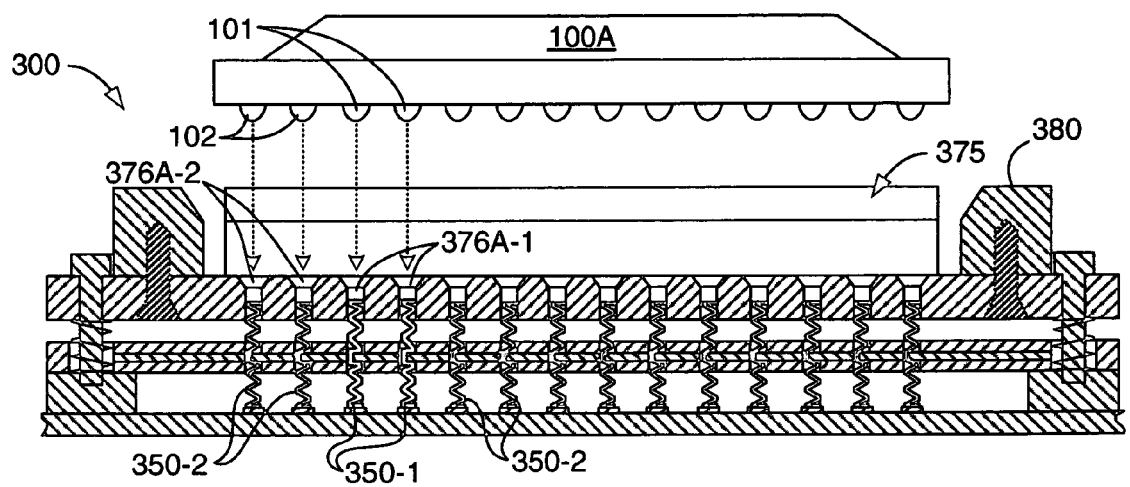
FIGS. 6(A), 6(B), and 6(C) are sectional side views of the hybrid interface apparatus of FIG. 4 illustrating a device testing operation.

Referring to FIG. 6(A), interface apparatus 300 is prepared for testing BGA IC 100A in the manner described above. In particular, contact-locking structure 340 of interface apparatus 300 is assembled such that low-inductance contact structures 350-1 are positioned below through-holes 376A-1, which in turn are positioned to receive high-speed solder balls 101. In addition, relatively high-inductance contact structures 350-2 are positioned below through-holes 376A-2, which in turn are positioned to receive solder balls 102. After securing low-inductance contact structures 350-1 and relatively high-inductance contact structures 350-2 in the manner described above, contact-locking structure 340 is mounted on frame 330, and the remainder of interface apparatus 300 is assembled in the manner described above. Interface apparatus 300 is then mounted in an IC testing system in which a device handler (not shown) is used to position BGA IC 100A over test area 375 (as shown in FIG. 6(A)).

Figure 6B:
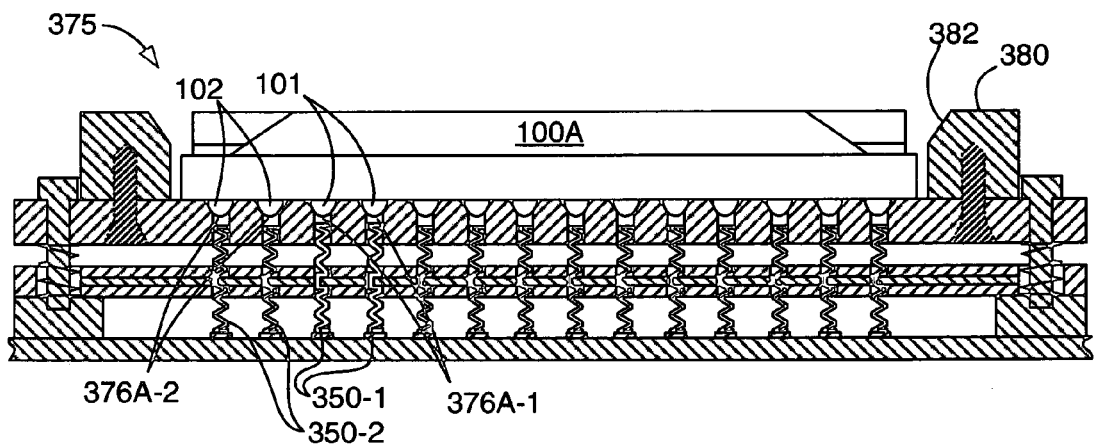

As indicated in FIG. 6(B), the device handler then releases BGA IC 100A so that it falls generally into nesting area 375 between positioning members 380. Positioning members 380 include slanted walls 382 that facilitates "rough" positioning by causing BGA IC 100A to slide into the test area 375. Subsequently, each solder ball of BGA IC 100A becomes engaged with an associated chamfer of a corresponding through hole 376, thereby providing "fine" alignment of BGA IC 100A relative to contact springs 350. In particular, BGA IC 100A becomes engaged such that high-speed solder balls 101 become engaged with through-holes 376A-1, and low-speed solder balls 102 become engaged with through-holes 376A-2.

Figure 6C:
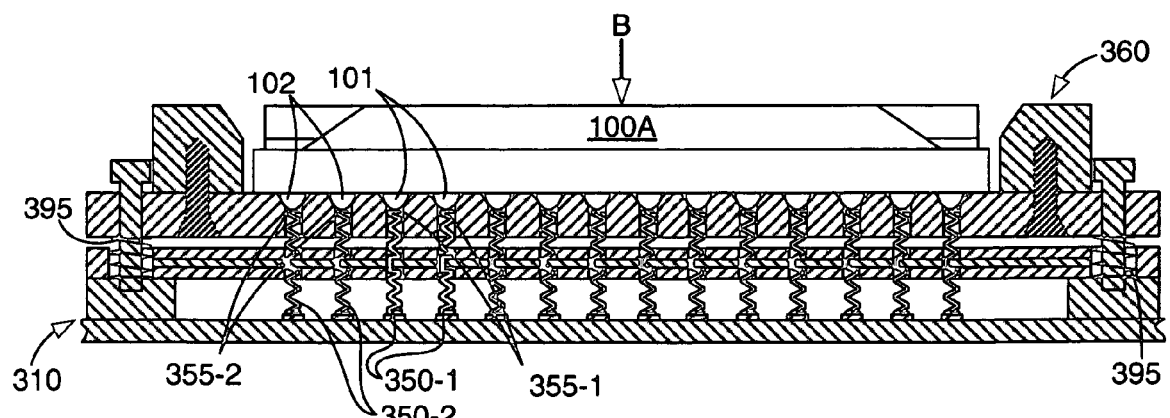

Referring to FIG. 6(C), the device handler (not shown) then pushes BGA IC 100A and nesting member 360 downward toward fixed base 310 (as indicated by arrow B) such that upper ends 355-1 of high-speed spring contacts 350-1 and upper ends 355-2 of general-purpose spring contacts 350-2 extend through associated through-hole 376-1 and 376-2 to contact associated solder balls 101 and 102, respectively. While solder balls 101 and 102 of BGA IC 100A are connected to spring contacts 350-1 and 350-2 in this manner, electrical test signals are then transmitted between a tester (not shown) and BGA IC 100A via PCB 320 and spring contacts 350-1/2. Upon completion of the test signal transmission, the device handler then removes BGA IC 100A, and nesting member 360 is biased into the original position (shown in FIG. 5) by coil springs 395. The testing procedure shown in FIGS. 6(A) and 6(B) is repeated as often as necessary to test all of an IC manufacturer's devices having the same package size and pin arrangement as BGA IC 100A.

FIGS. 7(A) through 7(D) show various spring structures utilized by interface apparatus 300 in accordance with an embodiment of the present invention.

Figure 7A:
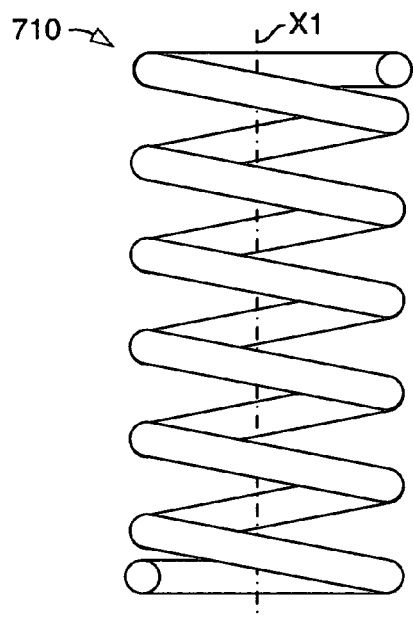
FIGS. 7(A), 7(B), 7(C), and 7(D) show various spring contacts utilized in the hybrid interface apparatus of FIG. 4.

FIG. 7(A) shows a standard helical spring contact 710 defining a central axis X1 that is formed by coiling a standard metal wire using known techniques. Spring contact 710 may be utilized, for example, to facilitate communications with general-purpose I/O structures of an IC device.

Figure 7B:
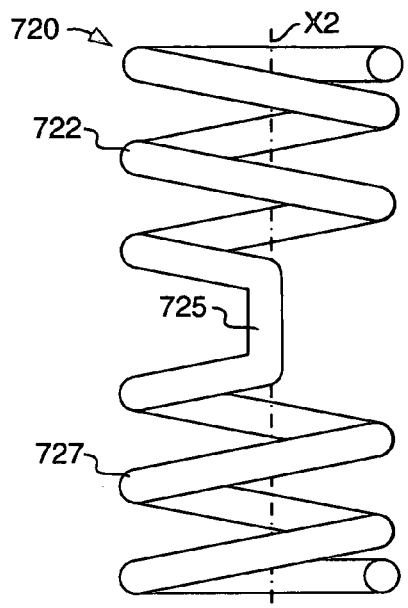

FIG. 7(B) shows a low-inductance two-part spring contact member 720 including an upper (first) helical section 722 that is turned in a first (e.g., clockwise) direction around a central axis X2, a relatively straight intermediate portion 725 extending parallel central axis X2 from a bottom coil of upper section, and lower (second) helical section 727 turned in a counterclockwise direction around axis X2 and connected to the lower end of intermediate portion 725.

Figure 7C:
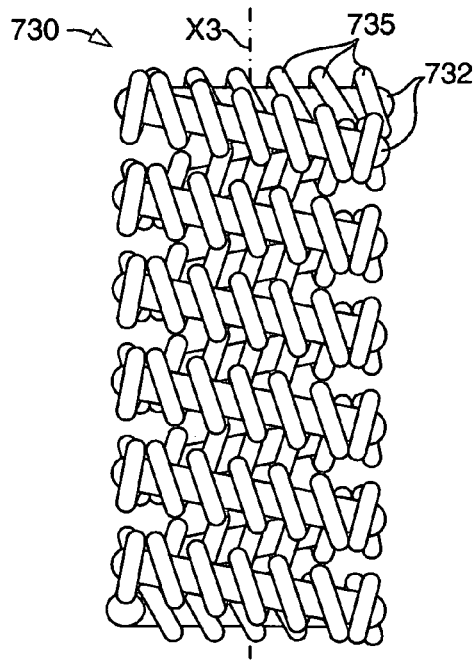

FIG. 7(C) shows a low-inductance spring contact member 730 including a helical spring structure 732 formed from a standard spring metal and defining a helical axis X3, and a wire 735 formed from a high-conductivity material (e.g., gold) that is wound around spring structure 732 such that each loop formed by high conductivity wire 735 is maintained at a substantially fixed distance from axis X3. Note that an additional spring structure can be formed by wrapping wire 735 around the two-part spring structure shown in FIG. 7(B).

Figure 7D:
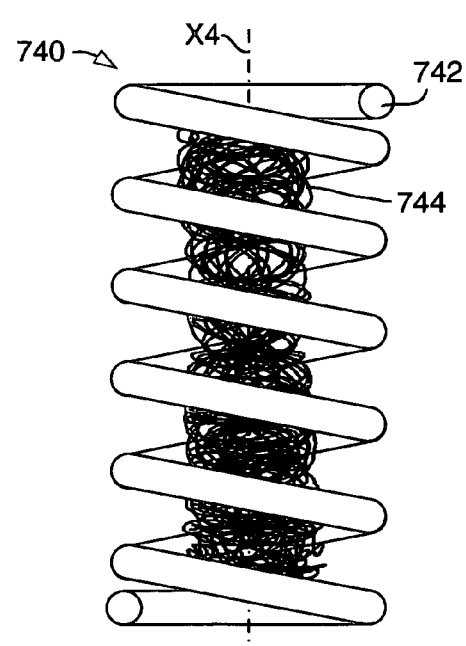

FIG. 7(D) shows a yet another low-inductance spring contact member 740 including a helical spring structure 742 formed from a standard spring metal and defining a helical axis X4, and a standard fuzz button-type contact structure 744 mounted inside of helical spring structure 742 and aligned along central axis X4. Note that fuzz button contact structure 744 is positioned such that when the nesting member is pressed toward the fixed base, compression of the helical spring structure 742 causes contact between the associated solder ball and the upper end of fuzz button contact structure 744.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A hybrid apparatus for interfacing between a device tester and a packaged integrated circuit (IC), the apparatus comprising:
   a fixed base including:
      a printed circuit board having an upper surface and including a plurality of contact pads formed on the upper surface, and
      a contact-locking structure mounted over the printed circuit board;
   a nesting member mounted over the fixed base such that the nesting member is movable toward the fixed base, the nesting member including a substrate disposed substantially parallel to the contact-locking structure and having an upper surface facing away from the fixed base, the upper surface including a test area defining a plurality of through-holes extending from the upper surface to a lower surface of the substrate,
   a plurality of spring-type contact members mounted to the contact-locking structure, each contact member being positioned such that a first end of said each contact member contacts a corresponding contact pad of the plurality of contact pads formed on the printed circuit board, and a second end of each contact member extends into a corresponding through-hole of the plurality of through-holes formed in the substrate of the nesting member;
   wherein a first contact member comprises a relatively low-inductance contact member to facilitate high-speed communication between the packaged IC and the printed circuit board when the packaged IC is mounted on the nesting member, and
   wherein a second contact member comprises a relatively high-inductance contact member to facilitate low-speed communication between the packaged IC and the printed circuit board when the packaged IC is mounted on the nesting member.

2. The apparatus of claim 1, wherein the first contact member comprises two-part spring structure having a first helical section turned in a clockwise direction, a second helical section turned in a counterclockwise direction, and an intermediate portion extending therebetween and secured by the contact-locking structure.

3. The apparatus of claim 2, wherein the first contact member comprises a relatively high-conductivity wire wrapped around the first and second helical sections.

4. The apparatus of claim 1, wherein the first contact member further comprises:
   a helical spring structure defining a central axis; and
   a high conductivity wire comprising a material that is wound around the helical spring structure such that each loop formed by the high conductivity wire is maintained at a substantially fixed distance from the central axis.

5. The apparatus of claim 1, wherein the first contact member further comprises:
   a helical spring structure defining a central axis; and
   a fuzz button structure mounted inside of the helical spring structure and aligned along the central axis.

6. The apparatus of claim 1, wherein the fixed base further comprises a frame mounted between the printed circuit board and the contact-locking structure, wherein the frame includes a wall surrounding the first ends of the plurality of contact members.

7. The apparatus of claim 1, wherein the contact-locking structure comprises:
   a fixed lower wall defining a first plurality of openings;
   a fixed upper wall defining a second plurality of openings aligned with the first plurality of openings; and
   a slidable intermediate wall sandwiched between the first and second walls, and including a third plurality of openings,
   wherein each contact member of the plurality of contact members extends through a corresponding first opening, a corresponding second opening, and a corresponding third opening, and
   wherein the slidable intermediate wall is positioned relative to the fixed lower wall and fixed upper wall such that a portion of said each contact member is pinched by an edge of the intermediate wall surrounding the corresponding third opening.

8. The apparatus of claim 1, further comprising:
   a plurality of guide shafts extending from the fixed base and slidably inserted into guide holes defined by the substrate of the nesting member; and
   a plurality of coil springs, each spring being positioned around a corresponding guide shaft and located between the fixed base and the nesting member.

9. A hybrid apparatus for interfacing between a device tester and a packaged integrated circuit (IC) including both high-speed Input/Output (I/O) structures and general-purpose I/O structures, the apparatus comprising:
   a fixed base including:
      a printed circuit board having an upper surface and including a plurality of contact pads formed on the upper surface;
      a contact-locking structure mounted over the printed circuit board; and
   a nesting member mounted over the fixed base such that the nesting member is movable toward the fixed base, the nesting member including a substrate disposed substantially parallel to the contact-locking structure and having an upper surface facing away from the fixed base, the upper surface including a test area defining a plurality of through-holes extending from the upper surface to a lower surface of the substrate, a plurality of spring-type contact members mounted to the contact-locking structure, each contact member being positioned such that a first end of said each contact member contacts a corresponding contact pad of the plurality of contact pads formed on the printed circuit board, and a second end of each contact member extends into a corresponding through-hole of the plurality of through-holes formed in the substrate of the nesting member;

wherein a first contact member comprises a relatively high-cost contact member that is suitable for facilitating communication between an associated high-speed I/O structure of the packaged IC and the printed circuit board when the packaged IC is mounted on the nesting member, and wherein a second contact member comprises a relatively low-cost contact member that is suitable for facilitating communication between an associated general-purpose I/O structure of the packaged IC and the printed circuit board when the packaged IC is mounted on the nesting member.

10. The apparatus of claim 9, wherein the first contact member comprises two-part spring structure having a first helical section turned in a clockwise direction, a second helical section turned in a counterclockwise direction, and an intermediate portion extending therebetween and secured by the contact-locking structure.

11. The apparatus of claim 10, wherein the first contact member comprises a relatively high-conductivity wire wrapped around the first and second helical sections.

12. The apparatus of claim 9, wherein the first contact member further comprises:

a helical spring structure defining a central axis; and a high conductivity wire comprising a material that is wound around the helical spring structure such that each loop formed by the high conductivity wire is maintained at a substantially fixed distance from the central axis.

13. The apparatus of claim 9, wherein the first contact member further comprises:

a helical spring structure defining a central axis; and a fuzz button structure mounted inside of the helical spring structure and aligned along the central axis.

14. The apparatus of claim 9, wherein the fixed base further comprises a frame mounted between the printed circuit board and the contact-locking structure, wherein the frame includes a wall surrounding the first ends of the plurality of contact members.

15. The apparatus of claim 9, wherein the contact-locking structure comprises:

a fixed lower wall defining a first plurality of openings;

a fixed upper wall defining a second plurality of openings aligned with the first plurality of openings; and a slidable intermediate wall sandwiched between the first and second walls, and including a third plurality of openings, wherein each contact member of the plurality of contact members extends through a corresponding first opening, a corresponding second opening, and a corresponding third opening, and wherein the slidable intermediate wall is positioned relative to the fixed lower wall and fixed upper wall such that a portion of said each contact member is pinched by an edge of the intermediate wall surrounding the corresponding third opening.

16. The apparatus of claim 9, further comprising:

a plurality of guide shafts extending from the fixed base and slidably inserted into guide holes defined by the substrate of the nesting member; and a plurality of coil springs, each spring being positioned around a corresponding guide shaft and located between the fixed base and the nesting member.

17. A method for testing a packaged integrated circuit (IC) including both high-speed Input/Output (I/O) structures and general-purpose I/O structures, the method comprising:

identifying the locations of solder balls of the packaged IC;

forming a hybrid interface apparatus including a plurality of spring-type contact members having a similar length and spring constants, wherein a first contact member comprises a relatively high-cost contact member that is suitable to facilitate communication between an associated high-speed I/O structure of the packaged IC and the printed circuit board, and wherein a second contact member comprises a relatively low-cost contact member that is suitable to facilitate communication between an associated general-purpose I/O structure of the packaged IC and the printed circuit board; and mounting the packaged IC on the hybrid interface apparatus such that a first end of the first contact member contacts the associated high-speed I/O structure of the packaged IC, and simultaneously, the low-cost contact member contacts the associated general-purpose I/O structure of the packaged IC.

* * * * *